United States Patent
Biber

(10) Patent No.: US 9,274,191 B2
(45) Date of Patent: Mar. 1, 2016

(54) GRADIENT-INDEPENDENT SHIM COIL FOR A LOCAL COIL OF A MAGNETIC RESONANCE DEVICE

(71) Applicant: Stephan Biber, Erlangen/Frauenaurach (DE)

(72) Inventor: Stephan Biber, Erlangen/Frauenaurach (DE)

(73) Assignee: Siemens Aktiengesellschaft, München (DE)

( * ) Notice: Subject to any disclaimer, the term of this patent is extended or adjusted under 35 U.S.C. 154(b) by 619 days.

(21) Appl. No.: 13/679,763

(22) Filed: Nov. 16, 2012

(65) Prior Publication Data

US 2013/0127468 A1    May 23, 2013

(30) Foreign Application Priority Data

Nov. 18, 2011 (DE) .......................... 10 2011 086 658

(51) Int. Cl.
*G01V 3/00* (2006.01)
*G01R 33/341* (2006.01)
*G01R 33/3875* (2006.01)
*G01R 3/00* (2006.01)
*G01R 33/34* (2006.01)
*G01R 33/565* (2006.01)

(52) U.S. Cl.
CPC ............. *G01R 33/341* (2013.01); *G01R 3/00* (2013.01); *G01R 33/3875* (2013.01); *G01R 33/34046* (2013.01); *G01R 33/56536* (2013.01); *Y10T 29/4902* (2015.01)

(58) Field of Classification Search
CPC .................................................. G01R 33/341
USPC ........................................................ 324/322
See application file for complete search history.

(56) References Cited

U.S. PATENT DOCUMENTS 5,173,661 A * 12/1992 Knuttel et al. ................ 324/309
7,414,401 B1 * 8/2008 Lvovsky ....................... 324/318
(Continued)

FOREIGN PATENT DOCUMENTS

| CN | 1886671 A | 12/2006 |
|---|---|---|
| CN | 101063708 A | 10/2007 |
| CN | 101290344 A | 10/2008 |
| CN | 101297211 A | 10/2008 |
| CN | 101435857 A | 5/2009 |

(Continued)

OTHER PUBLICATIONS

German Office Action dated Jul. 11, 2012 for corresponding German Patent Application No. DE 10 2011 086 658.2 with English translation.

(Continued)

*Primary Examiner* — Rodney Fuller
(74) *Attorney, Agent, or Firm* — Lempia Summerfield Katz LLC

(57) ABSTRACT

A shim coil device for installation and/or arrangement within a local coil of a magnetic resonance device is provided. The shim coil device includes at least one shim coil formed by at least one conductor loop, and at least one compensation coil formed by at least one conductor loop. The at least one shim coil and the at least one compensation coil are arranged in a same coil plane. An overall arrangement of the at least one shim coil and the at least one compensation coil is symmetrical about a first central axis and a second central axis. The first central axis and the second central axis are perpendicular to each other and lie in the coil plane. An overall induction surface is enclosed by the at least one conductor loop of the at least one compensation coil corresponding to an overall induction surface enclosed by the at least one conductor loop of the at least one shim coil.

18 Claims, 3 Drawing Sheets

(56) References Cited

U.S. PATENT DOCUMENTS

| | | |
|---|---|---|
| 2003/0098689 A1* | 5/2003 | Marek .................. 324/318 |
| 2005/0174118 A1 | 8/2005 | Kasten et al. |
| 2006/0012369 A1* | 1/2006 | Neufeld et al. ............ 324/318 |
| 2007/0146107 A1* | 6/2007 | Lvovsky et al. ............ 335/296 |
| 2008/0027308 A1 | 1/2008 | Ladebeck |
| 2012/0249142 A1* | 10/2012 | Biber et al. ............... 324/309 |
| 2012/0323113 A1 | 12/2012 | Biber |
| 2013/0154648 A1* | 6/2013 | Shen et al. ............... 324/322 |

FOREIGN PATENT DOCUMENTS

| | | |
|---|---|---|
| DE | 3914243 A1 | 10/1990 |
| DE | 10 2004 005 744 A1 | 8/2005 |
| DE | 10 2006 027 417 A1 | 12/2007 |
| DE | 10 2011 077 724 A1 | 12/2012 |

OTHER PUBLICATIONS

Chinese Office Action for Chinese Patent Application No. 201210472299.1, mailed Aug. 26, 2015 with English Translation.

* cited by examiner

GRADIENT-INDEPENDENT SHIM COIL FOR A LOCAL COIL OF A MAGNETIC RESONANCE DEVICE

This application claims the benefit of DE 10 2011 086 658.2, filed on Nov. 18, 2011, which is hereby incorporated by reference.

BACKGROUND

The present embodiments relate to a shim coil device for a magnetic resonance device.

Magnetic resonance imaging is a known, established imaging technique that is used in the medical engineering area. In order to obtain images useful for diagnostic assessment, the aim has been to obtain a signal-to-noise ratio (SNR) that is as high as possible. The use of local coils for this purpose is known. For example, antenna systems arranged in the immediate vicinity, on (anterior) or below (posterior) the patient, have been used. During the recording of magnetic resonance image data, the excited cores induce a voltage in the individual antennas or conductor loops of the local coils. The induced voltage is amplified with a low noise preamplifier (LNA) and forwarded via a cable to a receive device. The receive device further processes the magnetic resonance image data.

A further improvement in the signal-to-noise ratio (e.g., for high-resolution magnetic resonance images) is the aim of high-field systems. The basic magnetic field of high-field systems has a strength of, for example, 1.5 T to 12 T or more.

For all magnetic resonance imaging purposes, homogeneity of the basic magnetic field (B0) is of importance. If variations in the homogeneity of the imaging volume are too great, artifacts or distortions may arise. Also, specific applications such as fat saturation may no longer function. Fat saturation (e.g., fat set) is an imaging technique, in which the frequency shift of protons bound to fat or fatty materials is used. A saturation pulse at the fat frequency is used as a send pulse to exclude the frequency of signals originating from fatty tissue. Since the difference between the proton frequency in water and the proton frequency in fat is very small (e.g., equivalent to a few ppm of the basic field), this imaging technique is heavily dependent on the spatial homogeneity of the basic magnetic field. In such cases, a homogeneity of up to 0.5 ppm may be reached over imaging volumes of approximately 30×30 cm.

In this context, the influence of the object to be recorded (e.g., a patient) on the homogeneity of the basic magnetic field is not to be ignored. Thus, in the region of the nape of the neck of the patient, the body tissue is significantly susceptible to inhomogeneous body tissue distribution. Because of inhomogeneous body tissue distribution, distortions of the basic magnetic field may occur. To rectify these distortions, shim coils are used. In such cases, the number of different shim coils, their arrangement, and activation only allows a restricted number of degrees of freedom to compensate for inhomogeneities of the basic magnetic field. These inhomogeneities are generated by a mostly superconducting basic field magnet, by shim currents, and by corresponding shim magnetic fields, which are generated by conventional coils (e.g., copper coils). The options or degrees of freedom provided by the shim coils are not sufficient to compensate for inhomogeneities in many already known magnetic resonance devices (e.g., in the neck vertebrae area). A great jump in susceptibility arises precisely in the neck vertebrae area as a result of the transition from thorax to the neck/head.

However, homogeneity is not just disturbed by the presence of an object or patient to be detected, but may also be disturbed by the properties of the magnet system itself. For example, inhomogenities to be corrected may occur at the edge of the homogeneity volume.

German patent application DE 10 2011 077 724 proposes to compensate for sharply varying local magnetic fields within a magnetic resonance device by using shim coils as part of a local coil, so the shim coils are located close to the region of interest (roi) in the patient to be examined.

A problem with the use of magnetic resonance imaging in the field of the fat saturation techniques is inadequate fat saturation. Fatty tissue, in the area of the nape of the neck, for example, is still shown as brightly illuminated in an image, even though fat saturation techniques are designed to hide the fatty tissue in the image. This effect occurs because the fatty tissue in this area does not have the expected resonance frequency due to the local B0 variation. The saturation pulse, which should fully activate the spins of the fatty tissue, does not reach the spins, since the resonant frequency is different. A shim coil provided as part of the local coil may help to alleviate this issue.

An issue with this approach is that the shim coil is to be decoupled from the gradient field, since there may be no disruption of the shim activity and, therefore, also the shimming effect of the shim coil. Lowpass filtering may be used, since the gradient fields are low-frequency. However, the use of ferrite filters within the local coil and the use of ferrite filters of suitable size in the magnetic field is not possible. Ferrite-free filters are not used in a local coil because of the volume. Without such lowpass filtering, however, the current induced in the shim coil leads to a distortion of the gradient field or a distortion of the shim field generated by the local shim coil. Since the position in the k-space represents the time integral over the gradients, even small disturbances may accumulate rapidly over the sequence runtime. A further peculiarity of shim coils integrated into the local coil is that since the local coil itself is able to be moved directly or via the movement of the patient support, the decoupling is independent of the position of the shim coil integrated into the local coil in the longitudinal direction of the patient chamber (e.g., z-direction) and may have been realized independently of a position of the shim coil.

SUMMARY AND DESCRIPTION

The present embodiments may obviate one or more of the drawbacks or limitations in the related art. For example, a shim coil device is integrated into a local coil, where the shim coil is decoupled or able to be decoupled from the gradient fields.

One embodiment includes a shim coil device for a magnetic resonance device. The shim coil device is provided for installation in and/or arrangement within a local coil. The shim coil device includes at least one shim coil formed by at least one conductor loop, and at least one compensation coil formed by at least one conductor loop. The shim coil and the compensation coil are arranged in a same coil plane, and the overall arrangement of the shim coil and the compensation coil is symmetrical in relation to a first central axis and a second central axis. The first central axis and the second central axis are at right angles to one another (e.g., perpendicular to one another) and lie in the coil plane. An induction surface enclosed overall by the conductor loops of the compensation coil correspond to an induction surface enclosed overall by the conductor loops of the shim coil.

A shim coil device able to be integrated into a local coil may be provided. Despite the shim coil device being moveable (e.g., in the longitudinal direction of the patient chamber (z-direction)), the shim coil is, for example, decoupled from the gradient fields for all z-positions in the homogeneity volume of the basic field magnet of the magnetic resonance device. In such cases, the decoupling coil, which is described in greater detail below, is arranged close to the field-generating shim coil, so that the corresponding interaction described below is produced.

In order to achieve the decoupling, the shim coil device may be arranged (e.g., within the local coil), so that a central plane containing a first central axis is at right angles to a second central axis and contains the isocenter of the magnetic resonance device. The coil is rotated in any given way around the second central axis.

Another embodiment provides for a neck coil to be arranged below the isocenter of the magnetic resonance device. In this case, the z-axis may correspond to a central axis (e.g., a longitudinal axis) of the, for example, essentially cylindrical patient chamber, the y-axis may correspond to a vertical axis oriented at a right angle to the z-axis, and the x-axis may correspond to a horizontal axis oriented at right angles to each of the z-axis and the y-axis. With a patient lying on their back on the patient support above the local coil, the x-axis corresponds to the transversal axis, the y-axis corresponds to the sagittal axis, and the z-axis corresponds to the longitudinal axis. The description below using the x/y/z axes as examples may be translated in an equivalent manner to other axis arrangements.

It is assumed below that the gradient fields, as is usual with magnetic resonance devices, point in the z-direction. Further fields that are small, and thus are excluded from consideration here may also be generated by the gradient coils. The arrangement of conductor loops of the shim coils and the compensation coils is essentially in the coil plane, with small construction-related deviations of conductors from the coil plane, as are known to the person skilled in the art, also being within the meaning of the arrangement in one coil plane.

The local coil and thereby the shim coil may never be arranged, in relation to the y axis, precisely in the isocenter, since, for example, in the embodiment as neck coil, the neck coil is located below the isocenter. There is thus no opportunity for the shim coils to assume positive y-gradients and negative y-gradients (or the assigned fluxes), for which the shim coils would have two surface areas located above and below the isocenter.

In another embodiment, the shim coil may be arranged in one coil plane and may have the first central axis as a first axis of symmetry. In the present example, the shim coil may be arranged in the transversal plane (xy), with the shim coil being embodied symmetrically to the sagittal plane. In this way, a decoupling from x-gradients is produced, since the corresponding proportions cancel each other out. In such cases, the isocenter is located within the sagittal plane, which, for example, also corresponds to the central plane. In this embodiment, it is assumed that, with the linearity of the gradients, the magnetic flux also responsible for the induction (e.g., to be avoided) in the conductor coils of the shim coil device also has a spatially corresponding linear curve. This is because at each point in time, the gradient coils generate such a linear curve, and thus, the assumption that the partial derivation of the field components also has a linear curve over time is justified.

To further simplify the consideration, it may be assumed that the isocenter also lies in the transversal plane, which corresponds, for example, to the coil plane. A decoupling from the z-gradient is thus already provided.

In relation to the y-gradient, the problem of an arrangement of the shim coil in the isocenter not being possible, since a region of interest (roi) to be recorded is to be located at the isocenter, exists. In another embodiment, a compensation coil that is arranged symmetrically to the sagittal plane (yz) is provided. The compensation coil is thus decoupled from the x-gradient because of the typical arrangement in the transversal plane (xy) containing the isocenter also being decoupled from the z-gradient in the coil plane.

The fact that positive and negative fluxes may not be recorded when the y-gradients are switched provides that an induction occurs in the shim coil, which alone is not decoupled. The conductor loops of the compensation coil are thus additionally provided (e.g., provided like the conductor loops of the shim coil) symmetrical to the second central axis (e.g., corresponding to an axis through the isocenter parallel to the transversal axis). This is provided because a simultaneous decoupling from z-gradients and from y-gradients is provided if the compensation coil (e.g., a decoupling coil) exhibits the same symmetry in relation to the second central axis as the shim coil. This has a series of side effects. The shim coil and the compensation coil experience the same mean flux (e.g., along the second central axis) so that the compensation is provided by a surface similarity. Even deviations that arise through tilting of the shim coil device around the second central axis allow a compensation through the compensation coil, since it is relevant because of the symmetry, whether contributions to be compensated for originated from z-gradients or from y-gradients. Another result is that with the movement of the shim coil device in the z-direction, a decoupling in relation to all gradients occurs. This is evident in cases, in which the coil plane no longer contains the isocenter, but isocenter is only contained in the central plane.

Because of the symmetries explained, the shim coil device lies only in the x-coordinate of the isocenter, and tilting and deviation from the y-coordinate or the z-coordinate of the isocenter may be corrected by the compensation coil.

Shim coil devices, in which the compensation coils do not exhibit any symmetry in relation to the second central axis, with no z-decoupling possible in the described sense, may be used. The surface that is enclosed by the conductor surfaces of the compensation coil is then defined by corresponding integral consideration.

While the coil plane may contain the isocenter, this is not necessary (e.g., with respect to z-movability and still maintained z-decoupling).

Another embodiment provides for a decoupling of a shim coil to be provided in a local coil from all gradients. The shim coil thus functions smoothly. An additional compensation coil and the above-described symmetries are provided for this embodiment.

In another embodiment, the arrangement of the shim coil device may be selected so that at least one conductor section of the conductor loop of the shim coil is disposed closer to the isocenter (e.g., to the region of interest (roi) to be recorded) than all conductor sections of the conductor loop of the compensation coil. In this way, the effect of the conductor section located close to the roi being completely negated by conductor sections of the compensation coil is avoided, so that a field-forming effect remains. This conductor section may be a conductor section running in parallel to the second central axis. For example, in the event of a tipping of the shim coil device around the second central axis, the arrangement may also be selected so that two conductor sections running in parallel to the second central axis may be used to act in a field-forming way (e.g., homogenizing the region of interest or regions of interest). Since the compensation coil is additionally available and at least partly influences this affect, the overall affect that higher shim currents are needed may also be produced.

In one embodiment, the extent of the conductor loops of the compensation coil in a direction of the first central axis may be smaller than the extent of the conductor loop of the shim coil in a direction of the first central axis. The greater the difference is, the further is the difference between the conductor sections of the conductor loop contributing to the shim effect (e.g., conductor sections of the conductor loop of the compensation coil running parallel) so that a greater proportion of the affect remains.

In a further embodiment, the shim coil and/or the compensation coil may be fed by at least one adjustable constant current source. Further parasitic coupling effects may be reduceable or eliminated entirely, since decoupling may not be ideal. Thus, the field of the shim coil may be kept constant by being controlled by a constant voltage source that may be quickly adjusted. Since the decoupling is provided by the gradients, the demands on such a constant current source are reduced.

An additional embodiment provides that the shim coil and the compensation coil may be connected serially. If this type of serial connection is provided, and the winding directions of the shim coil and of the compensation coil are aligned in opposite directions, a simple circuit that directly negates the affects of the gradients or the switching of the gradients on the shim coil is produced. This is because the currents induced in the shim coil (e.g., because of the y-gradients) are generated precisely opposed to the compensation coil so that decoupling is present overall.

In a further embodiment, the compensation coil may include at least two conductor loops arranged on a side next to the shim coil. In this case, to establish the corresponding symmetries, there may, for example, be adjacent conductor loops of the compensation coil to the left and right along the second central axis of the shim coil. The adjacent conductor loops of the compensation coil may have a smaller extent in the direction of the first central axis.

In an embodiment, the compensation coil includes at least two concentric conductor loops to be arranged within and concentric to the conductor loop of the shim coil. In this case, the surface within the shim coil is used to provide the compensation coil or the conductor loops of the compensation coil. This may result in a more compact design overall.

In addition to the shim coil device, the embodiments may relate to a local coil device that includes a shim coil device. In this case, the arrangement as described above may, for example, be selected. All information provided regarding the shim coil device may be transferred in a similar way to the local coil device, with which the stated advantages may thus also be achieved.

A local coil of this type may, for example, be embodied as a neck coil or as a head coil.

The present embodiments may also relate to a magnetic resonance device including a local coil. The complete arrangement may be selected so that a central plane containing the first central axis, at right angles to the second central axis, contains the isocenter. Twisting around the second central axis may be any given amount. Thus, a number of outer conductor sections of the shim coil may be used in order to influence the field at different locations with respect to the homogeneity.

For the magnetic resonance device, the information relating to the local coil and the shim coil device may be transferred accordingly.

Embodiments may also relate to a method for placing a shim coil device, with the shim coil arrangement being arranged within the local coil, so that a central plane containing the first central axis at right angles to the second central axis contains the isocenter of the magnetic resonance device. The shim coil arrangement is rotated in any way around the second central axis. In this way, the decoupling of all three gradients oriented perpendicular to one another is achieved. For example, the arrangement may be made such that the coil plane contains the isocenter. This is not necessary for a movement from the z-coordinate of the isocenter, because with the symmetries and the presence of the compensation coil, the decoupling from the z-gradients is also still maintained.

DETAILED DESCRIPTION OF THE DRAWINGS

Figure 1:
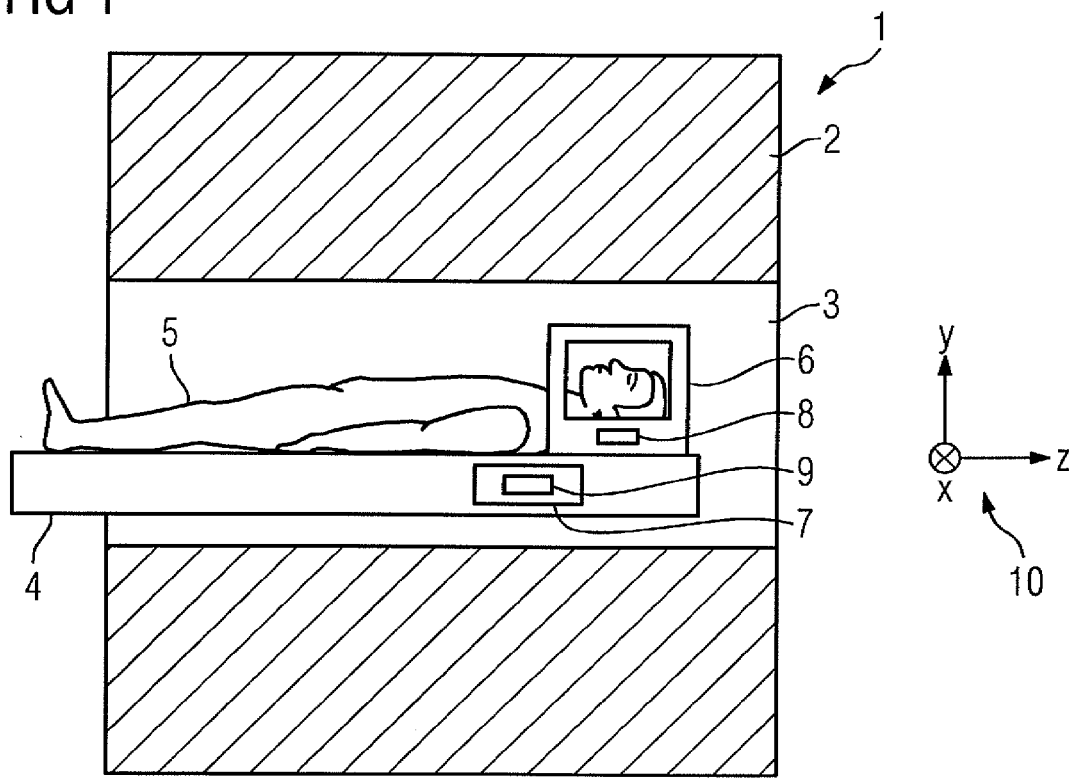
FIG. 1 shows a diagram of an embodiment of a magnetic resonance device with one embodiment of a local coil.

FIG. 1 shows a basic diagram of a cross-section of a magnetic resonance device 1. This embodiment includes a basic magnetic field unit 2 with a patient chamber 3, into which a patient support 4 may be introduced. Within the patient chamber 3, the gradient coils are not shown in any greater detail, and the whole body high-frequency coil is provided. A patient 5 may be moved on the patient support 4 into the patient chamber 3 in order to carry out examinations (e.g., to record the magnetic resonance signals with local coils), with a local coil 6 embodied as a head coil and a local coil 7 embodied as a neck coil being provided in the patient support, for example, as shown in FIG. 1. Shim coil devices 8, 9 are provided in both the local coil 6 and the local coil 7. The shim coil devices 8, 9, arranged in a specific axis of symmetry, include at least one shim coil and at least one compensation coil. The shim coil devices 8, 9 are arranged such that a decoupling from gradient fields is provided in the x-, y- and z-direction, as are defined on the basis of the coordinate system 10. The z-direction may correspond to a longitudinal direction of the patient chamber 3, which also corresponds to a field direction. The x-direction marks a horizontal transverse direction, and the y-direction marks a vertical direction. A gradient is present if the z-component of the magnetic field changes in a linear manner in the corresponding direction. It is assumed in the considerations below that the basic magnetic field and the gradient fields are present in the z-direction.

Figure 2:
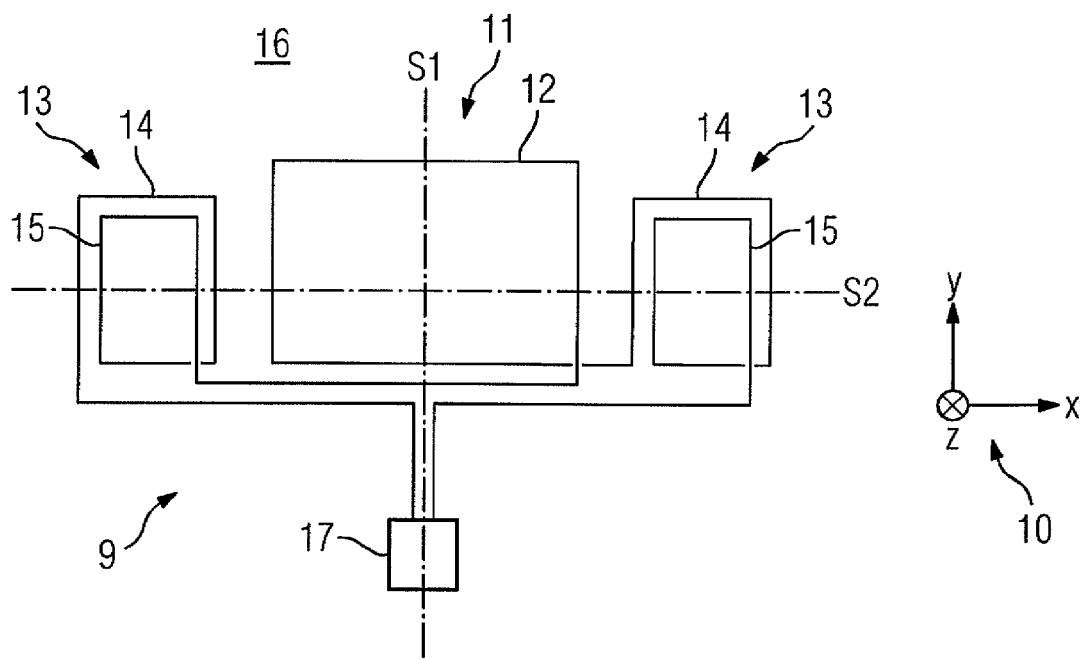
FIG. 2 shows a diagram of an embodiment of a shim coil device circuit.
Figure 3:
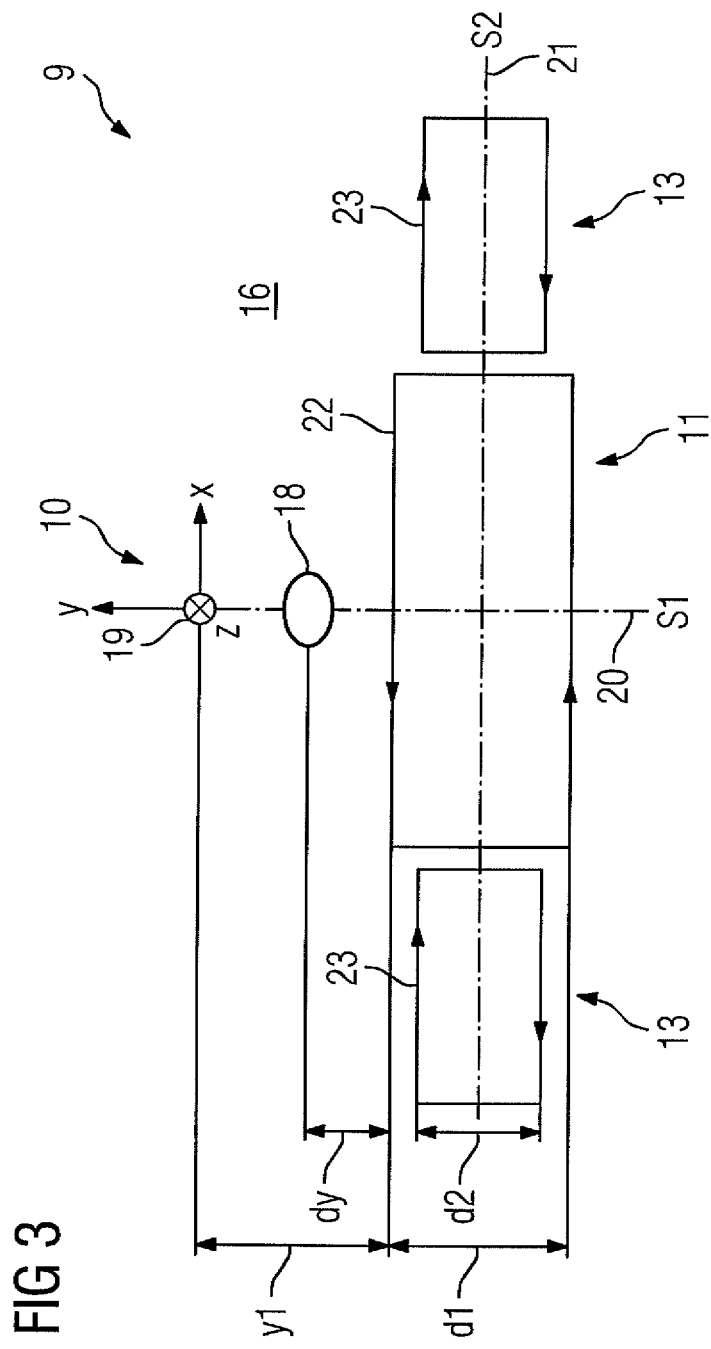
FIG. 3 shows a diagram for relative arrangement of the coils of an embodiment of the shim coil device.

FIG. 2 shows the basic structure and the circuit tree of the shim coil device 9, the overall geometry of which is explained more precisely with respect to FIG. 3.

In one embodiment, the shim coil device 9 includes a shim coil 11 with a conductor loop 12 and two compensation coils 13 each with conductor loops 14, 15. The shim coil 11 and the two compensation coils 13 are connected in series and have a different direction of winding. The shim coil 11 and the two compensation coils 13 lie in a coil plane 16 that corresponds to an x-y plane of, for example, coordinate system 10. For power supply, a constant current source 17 that makes adjustments with a time constant in the range of 1-1000 μs is provided.

FIG. 3 shows the symmetries and geometrical properties of the shim coil device 9 explained in greater detail. In addition to the shim coil device 9, a region of interest (roi) 18 and the isocenter 19 are shown. The isocenter 19 may be the origin of the coordinate system 10. The shim coil device 9 arranged, for example, in the x-y plane as coil plane 16 has two axes of symmetry in relation to the overall arrangement of the shim coil 11 and the two compensation coils 13. For example, the two axes of symmetry include an axis of symmetry S2 parallel to the x axis, and an axis of symmetry S1 corresponding, for example, to the y axis. The axis of symmetry S1 is a first central axis 20. The axis of symmetry S2 is a second central axis 21. A central plane at right angles to (e.g., perpendicular to) the second central axis 21 contains the first central axis 20 and thus the isocenter 19.

The surface AS (e.g., number of windings NS=1) enclosed by the conductor loop 12 of the shim coil 11 corresponds to a total of surfaces A1 (e.g., N1=2) enclosed by the conductor loops 14, 15 of the compensation coils 13. Thus, the following may apply: AS×NS=A1×N1+A1×N1.

The decoupling is produced in the following way. The symmetry of the shim coil 11 and the compensation coil 13 in relation to the first central axis 20 (e.g., the y-z plane) looks after the decoupling in relation to the x-gradient, since the central plane contains the isocenter 19. As a result of the magnetic flux emanating from the first central axis 20, rising in one direction and falling in the other direction based on the switching of the x-gradient, the contributions of both sides precisely match each other as a result of the linearity.

Since, in the following embodiment, no conductor loops run in the z-direction, the decoupling in relation to the z-gradient is still provided. The shim coil device 9 may, however, also be arranged so that the shim coil device 9 is tilted around the second central axis 21. Even if the shim arrangement 9 is not located at the z-position of the isocenter 19, the decoupling in relation to the z-gradient is still reproduced with the same mechanisms as described below for the y-gradient, which depends on the projections onto the corresponding planes.

For decoupling from the y-gradient, the shim coil arrangement 9 may not be arranged in the isocenter 19 but is arranged offset in the y-direction by an amount y1 from the isocenter 19. A decoupling such that positive and negative components of the gradient field cancel each other out, as is the case with x-gradient, thus does not come into question. This is why the compensation coils 13 are provided. The conductor loops of the compensation coils 13 enclose the same surface as the surface enclosed by the conductor loops of the shim coil 11. Since the winding direction is opposing, the induced currents cancel each other out. For a tilting around the second central axis 21, this effect also occurs in relation to the z-gradient. This occurs as a result of the symmetry in relation to the second central axis 21. The symmetry to the second central axis 21 (or to the x-z plane) thus makes a simultaneous decoupling from the z- and from the y-gradient possible.

Since this basic decoupling is provided, the remaining parasitic effects may be easily corrected by the current source 17 by corresponding control (e.g., keeping the shim coil current constant).

As shown in FIG. 3, the extent of the shim coil 11 in a direction of the first central axis 20, d1 is greater than the extent of the compensation coil 13 in a direction of the first central axis 20, d2. The conductor section 22 is located closest to the roi 18 and thus contributes most to the desired shim field in the roi 18. Because of the serial circuitry and the corresponding flowing currents, the fields generated by conductor sections 23 of the communication coils 13 act against the shim field of the conductor section 22. The fields generated by the conductor sections 23 are located further away from the roi 18, so that the effect remains even if higher currents are used.

Figure 4:
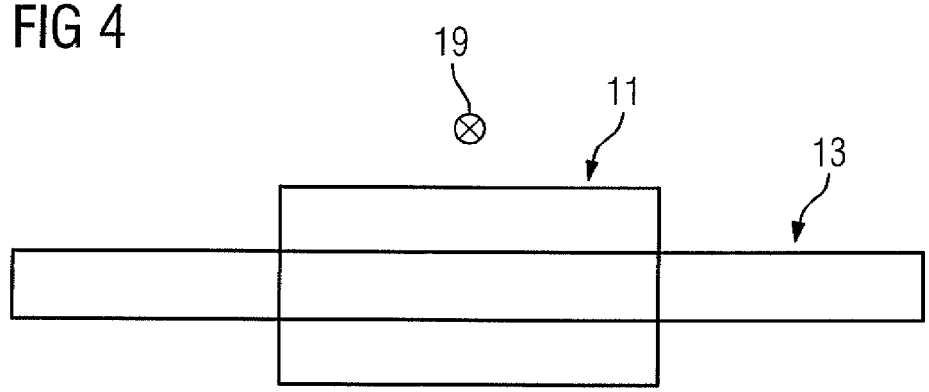
FIG. 4 shows a diagram of an embodiment of a relative arrangement of a shim coil and a compensation coil.
Figure 5:
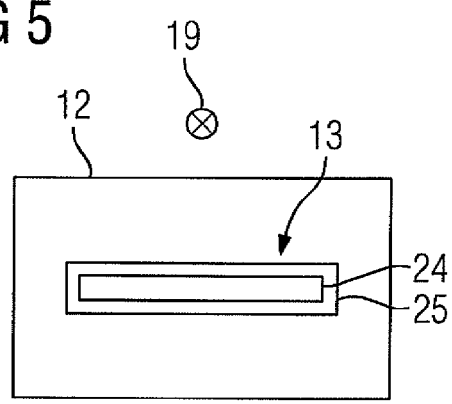
FIG. 5 shows a diagram of another embodiment of an arrangement of the compensation coil and the shim coil.

FIGS. 4 and 5 show other embodiments for the shim coil device 9, in which other arrangements of the shim coil 11 and the at least one compensation coil 13 are shown.

FIG. 4 shows an arrangement, in which an extremely wide arrangement of a single conductor loop has been selected for the one compensation coil 13, so that the one compensation coil 13 protrudes laterally beyond the shim coil 11.

FIG. 5 shows a compact embodiment, in which the shim coil 12 encloses the compensation coil 13 including the two conductor loops 24, 25.

Figure 6:
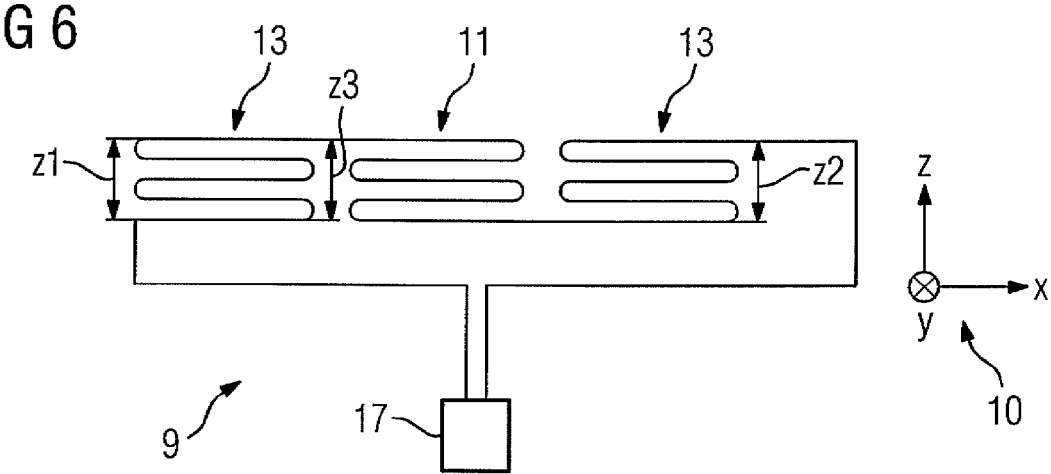
FIG. 6 shows a diagram for the extent of coils in the z-direction, according to one embodiment.

FIG. 6 shows an embodiment, in which the shim coil 11 and the compensation coil 13 also extend in the z-direction, with the extents z1, z2 and z3 in the z-direction corresponding to each other (e.g., z1=z2=z3).

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A shim coil device for a magnetic resonance device, the shim coil device, comprising:
    at least one shim coil formed by at least one conductor loop; and
    at least one compensation coil formed by at least one conductor loop,
    wherein the at least one shim coil and the at least one compensation coil are arranged in a same coil plane, and an overall arrangement of the at least one shim coil and the at least one compensation coil is symmetrical about a first central axis and a second central axis of the coil plane, and
    wherein the first central axis and the second central axis are perpendicular to each other and lie in the coil plane, and an induction surface is enclosed by the at least one conductor loop of the at least one compensation coil corresponding to an induction surface enclosed by the at least one conductor loop of the at least one shim coil,
    wherein the at least one shim coil and the at least one compensation coil are connected in series and have opposing directions of winding.

2. The shim coil device of claim 1, wherein the shim coil device is arranged within a local coil so that a central plane containing the first central axis is perpendicular to the second central axis and contains an isocenter of the magnetic resonance device.

3. The shim coil device of claim 2, wherein the coil plane contains the isocenter of the magnetic resonance device.

4. The shim coil device of claim 1, wherein the at least one shim coil, the at least one compensation coil, or the at least one shim coil and the at least one compensation coil are fed by at least one adjustable constant current source.

5. The shim coil device of claim 1, wherein an extent of the at least one conductor loop of the at least one shim coil is greater along the first central axis than an extent of the at least one conductor loop of the at least one compensation coil along the first central axis.

6. The shim coil device of claim 1, wherein the shim coil device is operable for fitting, arrangement, or fitting and arrangement within a local coil.

7. A shim coil device for a magnetic resonance device, the shim coil device, comprising:
- at least one shim coil formed by at least one conductor loop; and
- at least one compensation coil formed by at least one conductor loop,
- wherein the at least one shim coil and the at least one compensation coil are arranged in a same coil plane, and an overall arrangement of the at least one shim coil and the at least one compensation coil is symmetrical about a first central axis and a second central axis of the coil plane, and
- wherein the first central axis and the second central axis are perpendicular to each other and lie in the coil plane, and an induction surface is enclosed by the at least one conductor loop of the at least one compensation coil corresponding to an induction surface enclosed by the at least one conductor loop of the at least one shim coil,
- wherein the at least one compensation coil comprises at least two conductor loops arranged laterally next to the at least one shim coil, or wherein the at least one compensation coil is disposed within and concentric to the at least one conductor loop of the at least one shim coil, or a combination thereof.

8. A local coil for a magnetic resonance device, the local coil comprising:
- a shim coil device comprising:
  - at least one shim coil formed by at least one conductor loop; and
  - at least one compensation coil formed by at least one conductor loop,
- wherein the at least one shim coil and the at least one compensation coil are arranged in a same coil plane, and an overall arrangement of the at least one shim coil and the at least one compensation coil are symmetrical about a first central axis and a second central axis of the coil plane, and
- wherein the first central axis and the second central axis are perpendicular to each other and lie in the coil plane, and an induction surface is enclosed by the at least one conductor loop of the at least one compensation coil corresponding to an induction surface enclosed by the at least conductor loop of the at least one shim coil,
- wherein the at least one shim coil and the at least one compensation coil are connected in series and have opposing directions of winding.

9. The local coil of claim 8, wherein the shim coil device is arranged within the local coil so that a central plane containing the first central axis is perpendicular to the second central axis and contains an isocenter of the magnetic resonance device.

10. The local coil of claim 9, wherein the coil plane contains the isocenter of the magnetic resonance device.

11. The local coil of claim 8, wherein the at least one shim coil, the at least one compensation coil, or the at least one shim coil and the at least one compensation coil are fed by at least one adjustable constant current source.

12. The local coil of claim 8, wherein the at least one compensation coil comprises at least two conductor loops arranged laterally next to the at least one shim coil, or wherein the at least one compensation coil is disposed within and concentric to the at least one conductor loop of the at least one shim coil, or a combination thereof.

13. The local coil of claim 8, wherein an extent of the at least one conductor loop of the at least one shim coil is greater along the first central axis than an extent of the at least one conductor loop of the at least one compensation coil along the first central axis.

14. The local coil of claim 8, wherein the shim coil device is operable for fitting, arrangement, or fitting and arrangement within a local coil.

15. The local coil of claim 8, wherein the local coil is a neck coil or a head coil.

16. A magnetic resonance device comprising:
- a local coil comprising:
  - a shim coil device comprising:
    - at least one shim coil formed by at least one conductor loop; and
    - at least one compensation coil formed by at least one conductor loop,
  - wherein the at least one shim coil and the at least one compensation coil are arranged in a same coil plane, and an overall arrangement of the at least one shim coil and the at least one compensation coil is symmetrical about a first central axis and a second central axis of the coil plane, and
  - wherein the first central axis and the second central axis are perpendicular to each other and lie in the coil plane, and an induction surface is enclosed by the at least one conductor loop of the at least one compensation coil corresponding to an induction surface enclosed by the at least one shim coil conductor loop,
  - wherein the at least one shim coil and the at least one compensation coil are connected in series and have opposing directions of winding.

17. A method for placing a shim coil device, the shim coil device comprising at least one shim coil formed by at least one conductor loop and at least one compensation coil formed by at least one conductor loop arranged in a same coil plane, such that the at least one shim coil and the at least one compensation coil are symmetrical about a first central axis and a second central axis of the coil plane, the first central axis and the second central axis being perpendicular to each other and lying in the coil plane, an induction surface being enclosed by the at least one coil conductor loop of the at least one compensation coil corresponding to an induction surface enclosed by the at least one conductor loop of the at least one shim coil, the method comprising:
- arranging the shim coil device within a local coil device so that a central plane at right angles to the second central axis and containing the first central axis contains an isocenter of the magnetic resonance device,
- wherein the at least one shim coil and the at least one compensation coil are connected in series and have opposing directions of winding.

18. The method of claim 17, wherein the shim coil device is arranged so that the coil plane contains the isocenter.

* * * * *